United States Patent
Kumar et al.

(10) Patent No.: US 6,454,877 B1
(45) Date of Patent: Sep. 24, 2002

(54) LASER PHASE TRANSFORMATION AND ION IMPLANTATION IN METALS

(75) Inventors: Devendra Kumar, Rochester Hills, MI (US); Satyendra Kumar, Troy, MI (US); Michael L. Dougherty, Rochester Hills, MI (US)

(73) Assignee: Dana Corporation, Toledo, OH (US)

( * ) Notice: Subject to any disclaimer, the term of this patent is extended or adjusted under 35 U.S.C. 154(b) by 0 days.

(21) Appl. No.: 09/582,607
(22) PCT Filed: Dec. 12, 1998
(86) PCT No.: PCT/US98/27923

§ 371 (c)(1),
(2), (4) Date: Jun. 28, 2000

(87) PCT Pub. No.: WO99/35297

PCT Pub. Date: Jul. 15, 1999

Related U.S. Application Data

(60) Provisional application No. 60/076,945, filed on Jan. 2, 1998.

(51) Int. Cl.$^7$ .............................................. B23K 26/14
(52) U.S. Cl. ....................... 148/222; 148/224; 148/239; 148/565; 219/121.66; 219/121.85
(58) Field of Search ................................. 148/222, 224, 148/239, 565, 525; 219/121.66, 121.84, 121.85; 118/723

(56) References Cited

U.S. PATENT DOCUMENTS

| | | | |
|---|---|---|---|
| 4,894,511 A | * | 1/1990 | Caledonia et al. ..... 219/121.52 |
| 5,411,770 A | * | 5/1995 | Tsai et al. .................... 148/224 |
| 5,868,878 A | * | 2/1999 | Matossian et al. .......... 148/222 |

FOREIGN PATENT DOCUMENTS

| | | | |
|---|---|---|---|
| JP | 08-176650 | * | 7/1996 |
| WO | 99/35297 | * | 7/1999 |

* cited by examiner

*Primary Examiner*—George Wyszomierski
(74) *Attorney, Agent, or Firm*—Reising, Ethington, Barnes, Kisselle, Learman & McCulloch, P.C.

(57) ABSTRACT

A method and apparatus are provided for treating the surface of a metal body through phase transformation, ion implantation, and/or diffusion and to form new phases of metallic materials. The method and apparatus have been shown to be particularly useful to improve the hardness and corrosion resistance of ferrous and non-ferrous metals. Generally, the method comprises irradiating a portion of the metal body (18) with a laser (12), and directing a stream of gas (22) onto the same portion of the metal body simultaneously with and preferably for a duration after the laser is turned off. Preferably, the laser (12) is a carbon dioxide laser operated in a pulsed mode to control heating of the metal (18). The gas (22) is preferably carbon dioxide to quickly cool the metal when the laser is off, and to provide carbon atoms for deposition onto the body. The entire process may be carried out in an environment at atmospheric pressure, obviating the need for a vacuum chamber or pressure controlled furnace or similar apparatus. After treatment, the hardness and corrosion resistance of at least a ferrous body are dramatically increased. Advantageously, both sides of a thin metal body, such as a metal tube, may be simultaneously treated. Further, a new, highly oxygenated, hard and extremely corrosion resistant metal phase may be created.

26 Claims, 5 Drawing Sheets

LASER PHASE TRANSFORMATION AND ION IMPLANTATION IN METALS

REFERENCE TO CO-PENDING APPLICATION

This application claims the benefit of provisional application Serial No. 60/076,945 filed Jan. 2, 1998.

FIELD OF THE INVENTION

The present invention is directed generally to treating the surface of metals for increased hardening and corrosion resistance, and more particularly to laser phase transformation and ion implantation in metals.

BACKGROUND OF THE INVENTION

Lasers have been used for surface modification of ferrous metals. The high-energy flux associated with high-power laser beams can produce rapid localized heating at the surface of the metal. Depending upon the optical absorption coefficient of the metal at the laser illumination wavelength, most of the laser energy can be absorbed in a thin layer at the surface of the metal target. Use of a pulsed laser with pulses at a duration of a few microseconds or less produces very high surface temperatures, while the bulk of the material remains cool. When the laser pulse is extinguished, the heat deposited at the metal surface is rapidly self-quenched by conduction and diffusion into the cooler bulk of the metal. This rapid heating and cooling at the material surface causes transformation hardening, in which the surface material is transformed into phases that are harder and more wear resistant than the bulk of the metal. However, this process, as heretofore proposed is not well suited for use in conjunction with thin metal structures. The absence of material bulk does not provide cooling at a sufficient rate to generate the desired phase transformations.

Additionally, prior carbon deposition or carburizing techniques utilize controlled atmospheres, and polluting, hazardous or toxic gases. For instance, vapor deposition usually involves breaking down $CH_4$ or other hydrocarbon gases in a vacuum or low pressure atmosphere.

SUMMARY AND OBJECTS OF THE INVENTION

A method and apparatus are provided for treating the surface of a metal body through phase transformation, ion implantation and/or diffusion and to form new phases of metal materials. The method and apparatus have been shown to be particularly useful to improve the hardness and corrosion resistance of ferrous and non-ferrous metals. Generally, the method comprises irradiating a portion of the metal body with a laser, and directing a stream of gas onto the same portion of the metal body simultaneously with and preferably for a duration after the laser is turned off. Preferably, the laser is a carbon dioxide laser operated in a pulsed mode to control heating of the metal. The gas is preferably carbon dioxide to quickly cool the metal when the laser is off, and to provide carbon atoms for deposition onto the metal body. The entire process may be carried out in an environment at atmospheric pressure obviating the need for a vacuum chamber or pressure controlled furnace or similar apparatus. After treatment, the hardness and corrosion resistance of at least a ferrous metal body are dramatically increased. Advantageously, both sides of a thin metal body, such as a metal tube, may be simultaneously treated. Further, a new, highly oxygenated, hard and extremely corrosion resistant metal phase may be created.

It is therefore a general object of the present invention to provide an economical process for modifying the surface characteristics of metals, particularly ferrous metals, to increase surface hardness and/or corrosion resistance. Another object of the present invention is to provide a process of the described character that operates at atmospheric conditions. A further object of the invention is to provide a process of the described character that will simultaneously treat both surfaces of a thin metal object such as a metal tube. A still further object of the invention is to provide a process of the described character which uses a common, non-polluting gas. Another object of the invention is to form new metal phases. A still further object of the invention is to introduce atoms into metal substrates by diffusion and by ion implantation with the rapid and relatively simple method of the invention.

BRIEF DESCRIPTION OF THE DRAWINGS

The invention, together with additional objects, features and advantages thereof, will be best understood from the following description and the accompanying drawings in which.

DETAILED DESCRIPTION OF THE PREFERRED EMBODIMENTS

Figure 1:
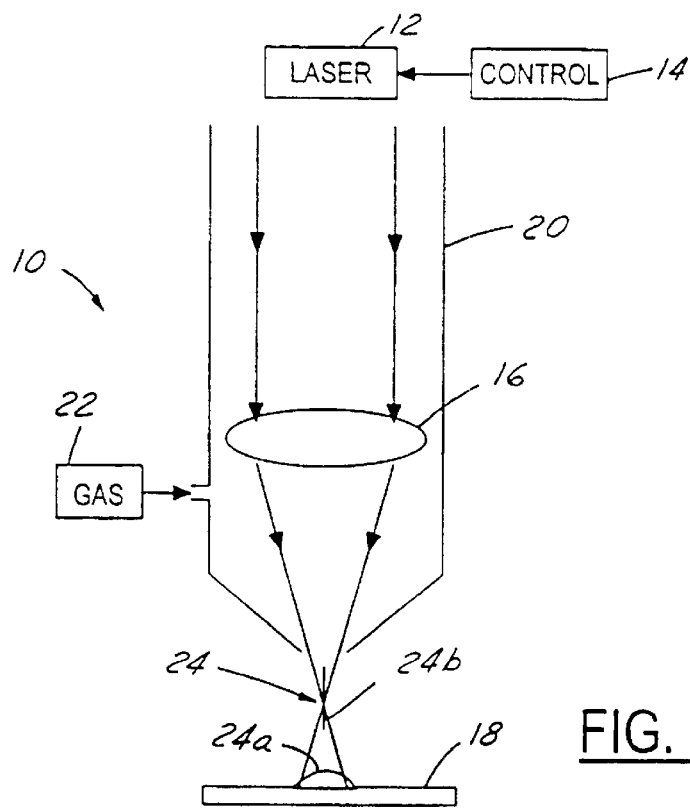
FIG. 1 is a schematic diagram of a laser surface modification system in accordance with one presently preferred embodiment of the invention.

FIG. 1 illustrates a system 10 in accordance with one presently preferred embodiment of the invention as comprising a pulsed carbon dioxide laser 12 coupled to a control circuit 14 for controlling the pulse width, total duration and power applied by laser 12. The output beam of laser 12 is focused by a lens 16 onto a metal target 18. Lens 16 is disposed within a nozzle 20 that receives gas under pressure, such as carbon dioxide from a source 22, and directs the gas onto the surface of a target 18 coaxially with the beam from laser 12. Gas 22 accelerates the cooling rate at the surface of target 18 in between laser pulses and after laser 12 is turned off. In addition, the beam energy from the carbon dioxide laser 12 dissociates molecules of the carbon dioxide gas to provide additional carbon atoms for deposition on the surface of target 18 to help carburize the surface and also additional oxygen atoms which may be implanted into the target. Dissociation of the gas molecules may be caused by the high intensity of the laser beam in the focal spot region, or the presence of a weak plasma in that region, or simply by the high temperature plasma 24a generated at the surface of the metal. Preferably, no melting of the target occurs during the treatment process.

The carbon dioxide gas stream-assisted cooling supplements the self-quenching effect discussed above, and is particularly important in connection with thin metal targets 18 in which the target material bulk is insufficient to self-quench the heated area with sufficient rapidity. Thus, this process, called "Dokulasing", is especially adapted for use on thin metal targets such as thin tubes and plates, as well as complicated or non-uniformly shaped objects. Additionally, the Dokulasing technique may also be used to treat the surfaces of thick metal targets. The rapid heating and rapid cooling effected during the Dokulasing process causes phase transformation of the metal target 18 which results in increased hardness and increased corrosion and wear resistance of at least the surface of the target 18. Notably, it is believed that rapid thermal shock waves produced by the pulsed laser heating in the presence of a high pressure jet of $CO_2$ gas result in efficient transformation hardening and carburization in thick as well as thin metallic samples.

Experiments were carried out employing a Rofin-Sinar Model 2500 carbondioxide laser (maximum power about 2500 watts) operated in a pulsed mode. The pulse durations were varied from a few microseconds to several milliseconds. A 10 cm focal length lens 16 was used to focus the laser beam energy, and target 18 was variably positioned in the range of about 0.875 to 1.75 inches away from the focal point of lens 16 so as to provide illumination at the surface of target 18 in a circle in the range of 5 to 10 mm in diameter. The pressure of the carbon dioxide gas at the tip of the nozzle 20 was varied in the range of 20 to 120 psi. Total exposure time was varied from a fraction of a second to a few seconds. The target 18 is preferably low carbon steel and, as tested, was a flat, low carbon steel coupon of 0.035 inch thickness.

The range of laser power employed, along with different exposure times, generated a wide range of surface effects, from little or no visible effect to a complete burning of a hole through the metal. At a laser exposure of 2000 watts for a total of 2 seconds, an illuminated spot diameter of 8 mm and a carbon dioxide gas pressure of 115 psi, the illuminated area of target 18 exhibited both an increased surface hardness in terms of scratch resistance, and an increase in corrosion resistance. The hardness of several test objects, measured on the Vickers Scale, was increased by a factor of about 2 due to the laser treatment. In an accelerated corrosion test, the laser-treated surface area did not show any sign of corrosion in over 320 hours, whereas the untreated surface areas began showing signs of corrosion in about 1½ hours under the same test conditions.

Figure 3:
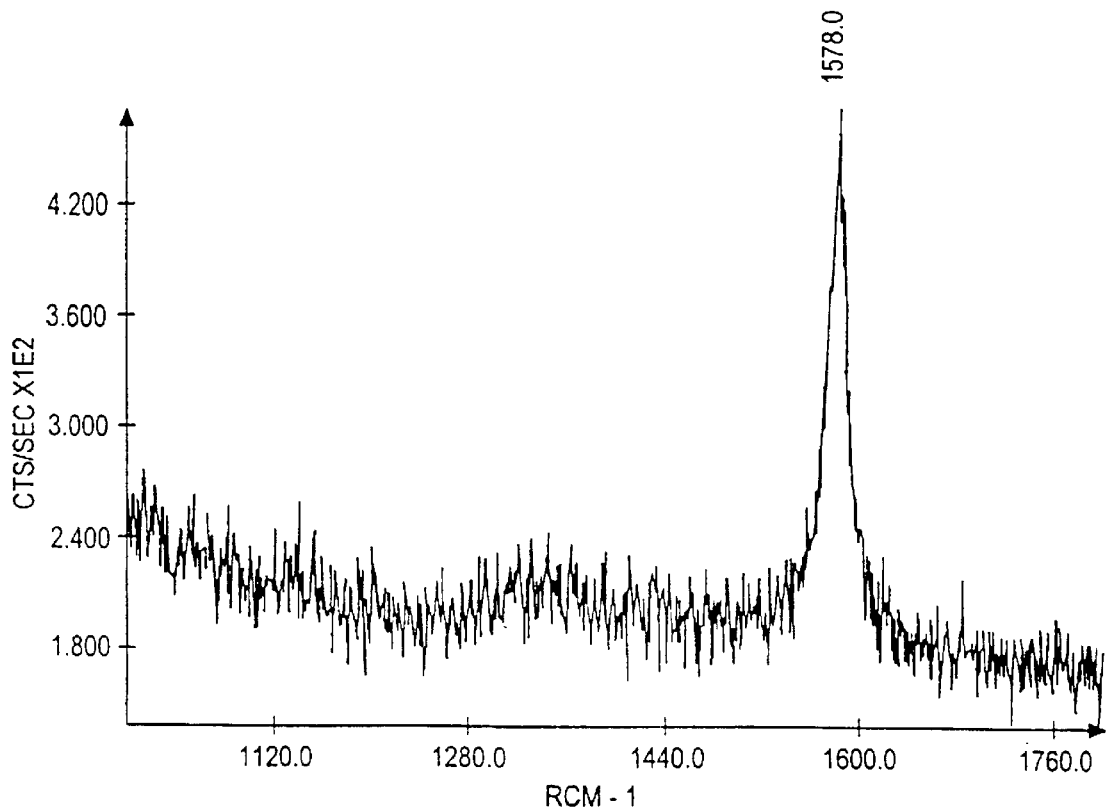
FIG. 3 is a Laser Raman spectral analysis of the test object illustrated in FIG. 2.
Figure 2:
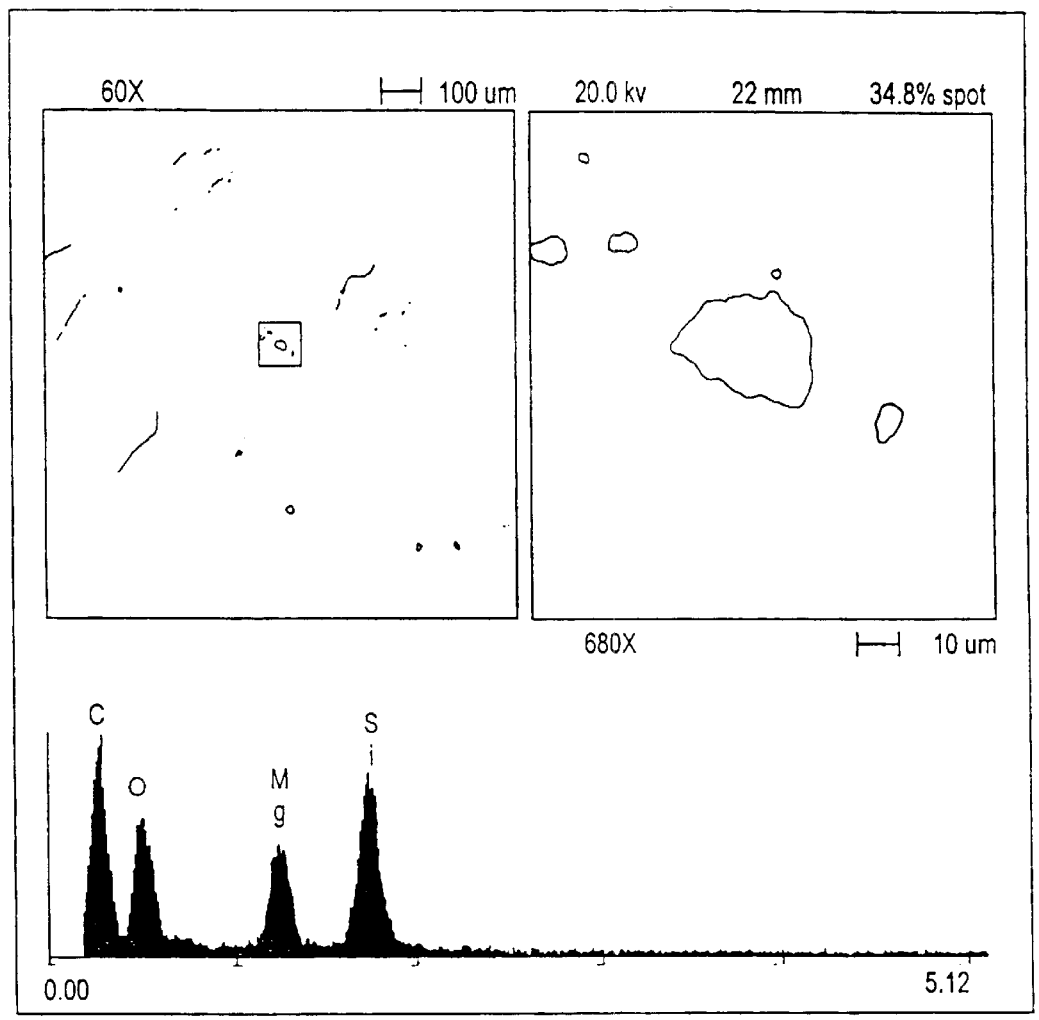
FIG. 2 illustrates scanning electron microscope analysis of test objects treated in accordance with the process of FIG. 1.
Figure 4:
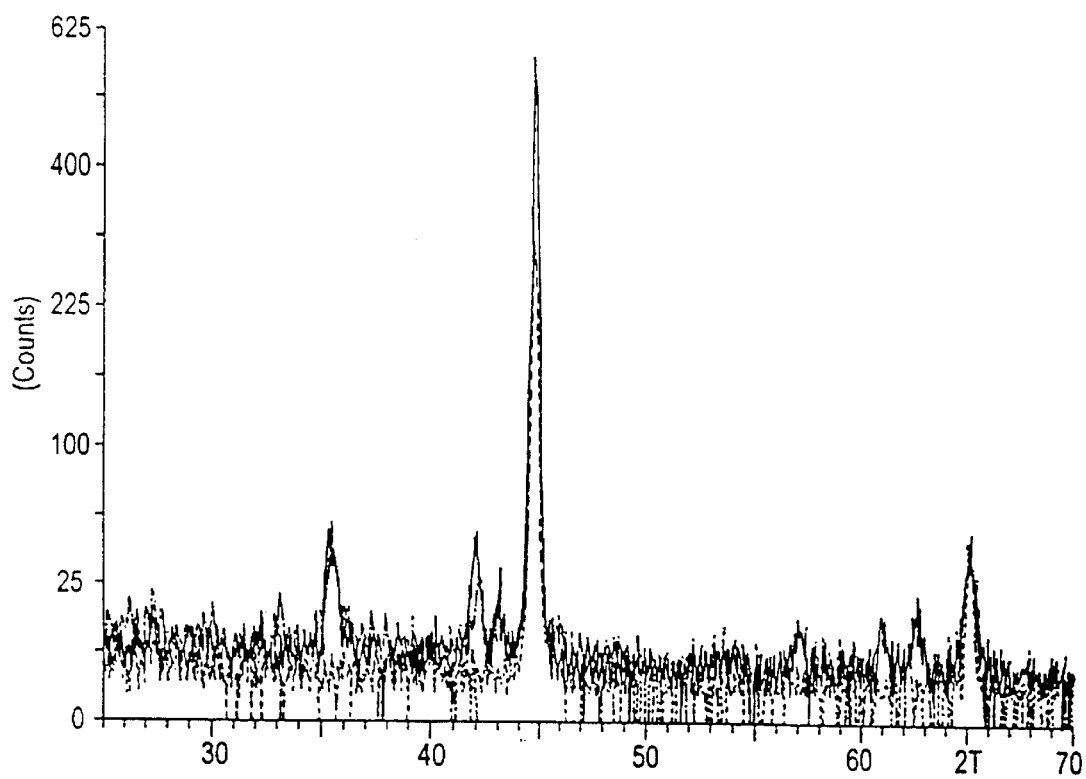
FIG. 4 illustrates a thin-film x-ray analysis of the surface of the test object illustrated in FIG. 2.

FIG. 2 illustrates on the left a scanning electron microscope analysis of one treated or Dokulased area approximately 1.3 mm square. Several black area are shown, ranging in size from 5 to 40 micrometers. The right-hand portion of FIG. 2 is a magnified view of the area enclosed within the rectangle in the left-hand portion of FIG. 2. X-ray elemental analysis along the lower edge of FIG. 2 shows the presence of carbon (and other elements) in this surface area. Laser Raman spectral analysis (FIG. 3) indicated that the carbon in these dark islands in FIG. 2 is graphitic in nature. The spectral peak at approximately 1578 $cm^{-1}$ is characteristic of graphitic carbon. Thin-film x-ray analysis (FIG. 4) revealed the presence of $Fe_3O_4$ on the laser treated surface areas. The test data illustrated in FIGS. 2–4 were obtained from the same target 18, although not necessarily from the same black spots in the target.

X-ray and electron diffraction analysis of crystal phases of treated areas showed phases which were different from all known phases and it is currently believed that a complex new metal phase is generated by the Dokulasing technique described. The electron diffraction indicated amorphous, polycrystalline and single crystal phases. The diffraction pattern indicates the presence of five crystalline phases and one amorphous phase. The crystalline phases have face centered cubic structures with lattice parameters in the range of about a =3.50 Å to a =3.65 Å.

The dominant crystalline, face centered cubic phase, called "dokumite," appears to contain iron, carbon and oxygen atoms in a face centered cubic matrix with a crystal structure that corresponds to gamma-iron in which octahedral sites are occupied by carbon and oxygen atoms in an atomic percentage in the range of about 10. The carbon and oxygen atoms can form an ordered array in the face centered cubic matrix because of the presence of reflections from Miller Index planes 110 and 211. The octahedral lattice structure has atomic spacing close to that of diamond, and a lattice parameter calculated to be in the range of a=3.60±0.02Å. Testing has shown that this new phase is very hard and extremely resistant to corrosion.

Figure 5:
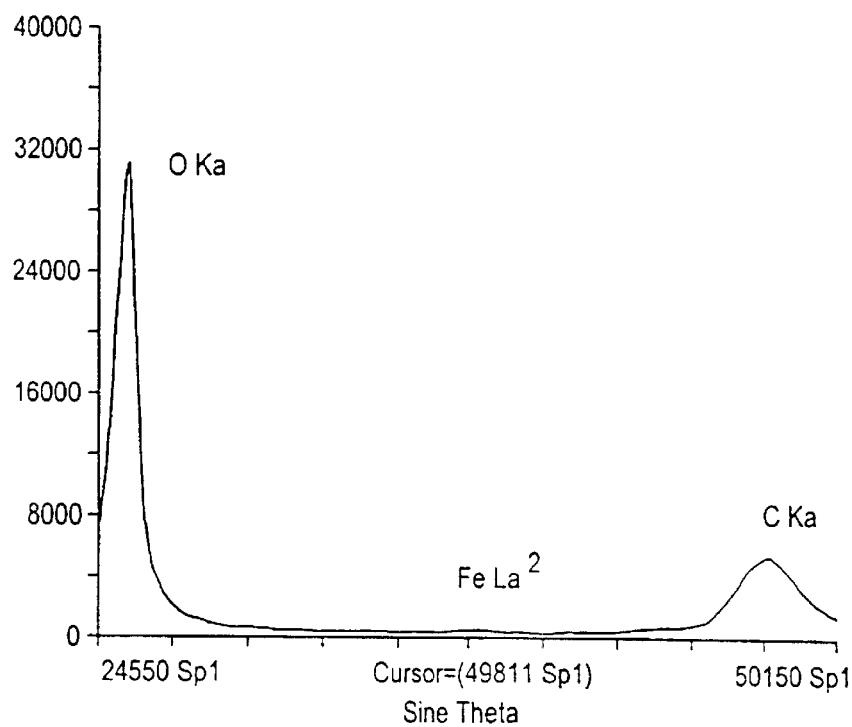
FIG. 5 illustrates x-ray microprobe analysis of the front surface of a treated low carbon steel test object.
Figure 6:
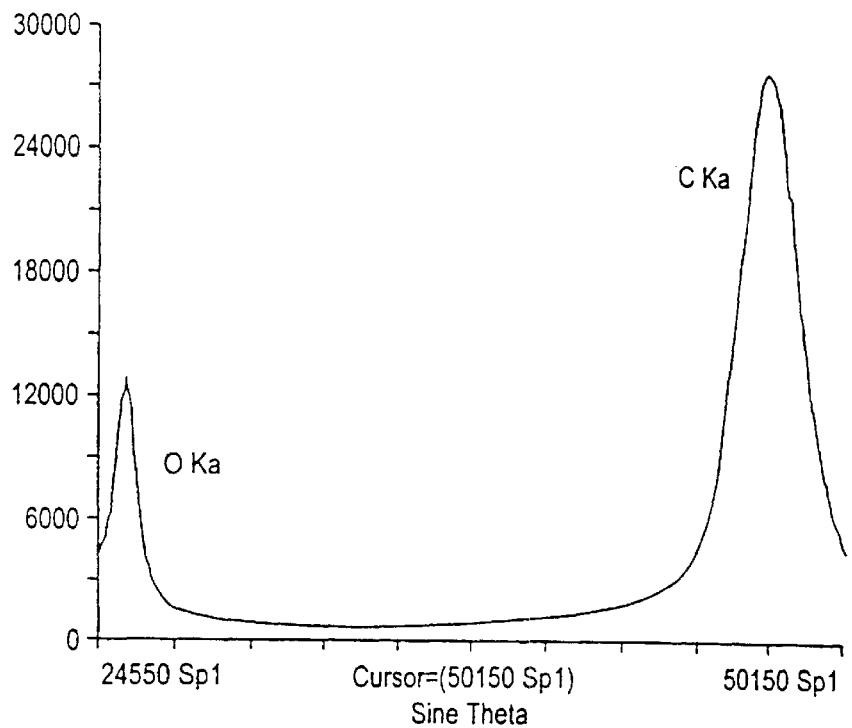
FIG. 6 illustrates x-ray microprobe analysis of the back surface of a treated low carbon steel test object.

The Dokulasing technique disclosed in the present application is particularly useful in connection with surface treatment of thin metal structures, such as thin metal tubes. Impingement of cooling gas on the target surface simultaneously with the laser energy rapidly cools and quenches the heated portion of the metal. Thus, in the case of thin metal structures (e.g., having a wall thickness of about one to two millimeters), the structure may be through-heated by the laser and then rapidly quenched by the gas, modifying the surface characteristics at both surfaces. Although the back or non-illuminated side of the target is not exposed to the quenching gas, hardening and an increase in corrosion resistance does take place. It is currently believed that some of the carbon atoms deposited on or striking the illuminated side of the target penetrate deep into the target by diffusion or ion-implantation. Indeed, empirical analysis, as shown in FIGS. 5 and 6, has shown a higher carbon content at a spot adjacent to the non-illuminated or back side (FIG. 6) than adjacent the illuminated or front side (FIG. 5) in a low carbon steel test target.

It is currently preferred to employ carbon dioxide cooling gas in combination with a carbon dioxide laser for enhanced dissociation of the cooling gas and thus generation of additional carbon atoms and molecules at the treated surface. However, it is also envisioned that other lasers and/or cooling gases. such as nitrogen or argon, may be employed. Although the coaxial nozzle/beam arrangement of FIG. 1 is currently preferred for reasons of simplicity, it is also envisioned that the cooling gas may be directed at the target surface separately from and at an angle to the laser beam.

Figure 7:
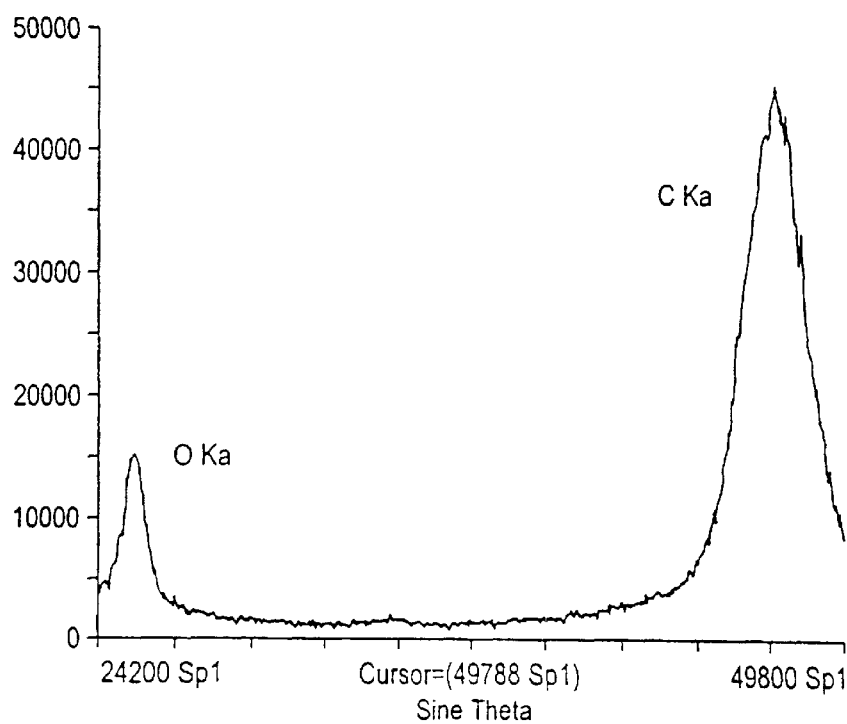
FIG. 7 illustrates x-ray microprobe analysis of the front surface of a treated nickel test object.
Figure 8:
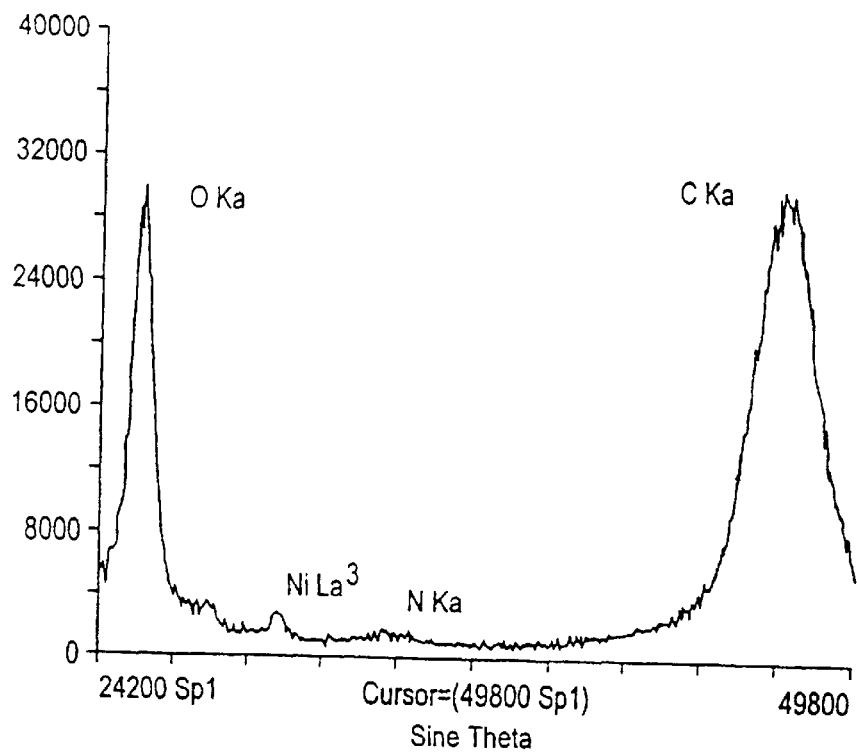
FIG. 8 illustrates x-ray microprobe analysis of the back surface of a treated nickel test object.

Additionally, testing, under similar conditions as those described previously for the low carbon steel targets, has been performed on a thin nickel sample (about 0.078 inch thick) which was essentially, if not completely, void of carbon before treatment. After treatment, significant oxygen and carbon atoms were present adjacent both the front or illuminated side of the nickel sample, as shown in FIG. 7, and the back or non-illuminated side of the nickel sample, as shown in FIG. 8. The presence of carbon in the treated nickel sample, which was void of carbon before treatment, indicates that implantation of at least carbon ions occurred during treatment. Additionally, the distribution of carbon and oxygen atoms suggests that some diffusion must also occur during treatment. Significantly and advantageously, such diffusion occurs at an extremely accelerated rate within the short duration of the treatment (on the order of a few seconds or less) compared to the rate of diffusion in previous diffusion techniques, such as conventional carburization which can take several hours or longer. New phases of nickel may also be created as indicated by the presence after treatment of oxygen and carbon atoms in the nickel sample. However, structural analysis of this material has not been completed.

Figure 9:
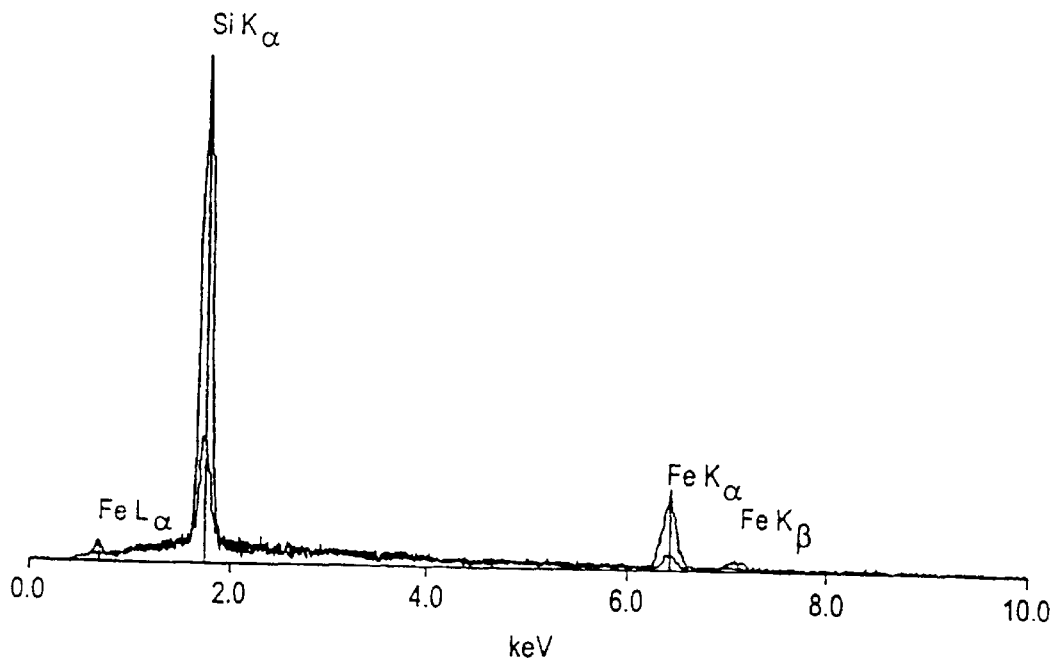
FIG. 9 illustrates x-ray microprobe analysis of a treated low carbon steel test object which was coated with silicon before being treated.

A still further test was performed on both a low carbon steel target and a nickel target after coating each target with a thin layer of silicon oil. The use of the silicon oil coating considerably increased the absorption of laser energy in both the low carbon steel and nickel test targets, and therefore, considerably accelerated the heating process. Analysis after testing, as shown in FIG. 9 for the steel target, indicated the presence of silicon atoms within the test targets indicating that silicon atoms produced after decomposition of the silicon oil also diffuse into the test targets to produce new compounds as well as new phases of known materials. This general process of ion implantation, enhanced diffusion and/or transformation hardening can be used with other types of coatings besides silicon oil, with other types of lasers and with other gases and targets of different metals to produce alloys or phases of materials with a wide range of physical and chemical properties as desired.

As shown in FIG. 1, a plasma 24 is generated during the treatment with $CO_2$ gas applied concentrically with a pulsed $CO_2$ laser beam. A generally hemispherical plasma 24a is generated near the metal surface being treated and a thin streak of plasma 24b is formed generally at the focal point of the lens 16. The length and diameter of the streak of plasma 24b increased with an increased power of the laser. Notably, the plasma 24 is generated at atmospheric pressure in ambient air conditions. Also, the high temperature in the plasma 24a. the composition of the plasma. and the $CO_2$ laser beam may provide appropriate conditions for the decomposition or dissociation of the $CO_2$ gas into carbon and other species. Another factor aiding the $CO_2$ gas dissociation is the high intensity of the laser beam near the focal point of the lens 16. In any event, the carbon atoms generated during treatment can be used for rapid carburization, carbide formation and diamond or diamond-like-carbon deposition.

There has thus been disclosed a laser treatment process that obtains the objectives and aims discussed above, and has a number of significant advantages over the prior art. The material surface transformation is carried out at atmospheric conditions, which means that vacuum reaction chambers or the like are not necessary. The carbon dioxide assist gas employed in the preferred embodiment of the invention is inexpensive and non-polluting. This assist gas not only provides rapid cooling by efficient heat transfer from the irradiated surface, but also serves as a source of (additional) carbon atoms to enhance the carburizing effect of the surface treatment which may account for at least some of the increase in hardness of a treated surface. Perfect spectral matching of the carbon dioxide assist gas absorption spectrum to the wavelength of the carbon dioxide laser is believed to be helpful in that the carbon dioxide gas molecules are optically excited and heated, which further assists in laser heating the illuminated surface. This synergetic heating continues as long as the laser is turned on, after which the gas operates in the cooling mode. The high temperature generated in the carbon dioxide gas and the high intensity of the laser beam will facilitate breakdown of carbon dioxide molecules into carbon (and other products) to assist carburization at the target surface. Furthermore, the atmospheric pressure plasma generated in the carbon dioxide assist gas has its own visible glow and numerous other applications.

The Dokulasing process of the present invention is particularly useful for surface treatment of thin materials such as metal sheets and tubes of small wall thickness although it may also be used to treat thick metal objects. Treatment of the one or front surface of a thin metal object automatically treats the other or back surface. The speed of surface treatment and/or carburization of ferrous metals is much faster than that for other conventional methods. The process of the present invention can be readily placed in commercial use with minimum capital expenditure. Advantageously, similar results are expected with different metals, different lasers, different assist gases as well as various coatings and the like.

What is claimed is:

1. A method of treating the surface of a metallic body, comprising the steps of:

irradiating a portion of the body with a laser beam;

applying a stream of gas onto said portion of the body simultaneously with said laser; and terminating the irradiating step while continuing, at least temporarily, to apply said stream of gas onto the body to cool it.

2. The method of claim 1 which also comprises the step of:

repeating said irradiating, applying and terminating steps on the same portion of the body to further treat the body as desired.

3. The method of claim 1 wherein said laser is a carbon dioxide laser.

4. The method of claim 1 wherein said gas is applied generally coaxially with said laser.

5. The method of claim 1 wherein said gas is applied at a pressure in the range of 20 to 120 psi.

6. The method of claim 1 wherein each of said steps is carried out in an environment generally at atmospheric pressure.

7. The method of claim 1 wherein said laser beam is pulsed on and off and said stream of gas is applied continuously.

8. A method of treating the surface of a metallic body, comprising the steps of:

irradiating a portion of the body with a beam of a carbon dioxide laser;

applying a stream of pressurized carbon dioxide gas onto said portion of the body simultaneously with said laser; and terminating the irradiating step while at least temporarily continuing to apply said stream of carbon dioxide gas onto the body to cool it.

9. The method of claim 8 which also comprises the step of:

repeating said irradiating applying and terminating steps on the same portion of said body to further treat said body as desired.

10. The method of claim 8 wherein said carbon dioxide gas is applied at a pressure in the range of 20 to 120 psi.

11. The method of claim 8 wherein said carbon dioxide gas is applied generally coaxially with said laser beam.

12. The method of claim 8 wherein each of said steps is carried out in an environment generally at atmospheric pressure.

13. A method of depositing carbon on a substrate, comprising the steps of:
   irradiating a portion of a substrate at atmospheric pressure with a beam of a laser; and
   applying a carbonaceous gas onto said portion of said substrate simultaneously with said laser beam to dissociate carbon atoms from said carbonaceous gas and deposit carbon atoms on said substrate.

14. The method of claim 13 where said carbonaceous gas is carbon dioxide.

15. The method of claim 13 where said laser is a carbon dioxide laser.

16. A method of introducing ions into a metal substrate comprising the steps of:
   (a) applying a stream of gas onto a portion of the metal substrate at atmospheric pressure; and
   (b) directing a laser beam into said stream of gas and onto the metal substrate at atmospheric pressure to dissociate ions from said gas and introduce at least some of said dissociated ions into said metal substrate.

17. The method of claim 16 wherein said gas is $CO_2$ and said beam is generated by a $CO_2$ laser.

18. The method of claim 17 wherein carbon and oxygen ions are dissociated from the $CO_2$ gas and implanted into the metal substrate.

19. The method of claim 16 which also comprises, before said step (a), the step of: (c) coating the metal substrate with a material containing ions desired to be introduced into the metal substrate, whereupon when said laser beam is directed onto said material on the metal substrate in said step (b), the laser beam dissociates ions from said material and introduces ions from said material into the metal substrate.

20. The method of claim 19 wherein said material coating on the metal substrate is a silicon oil, and silicon ions are introduced into the metal substrate.

21. A method of forming a plasma in a carbon dioxide gas stream in an environment at atmospheric pressure comprising the steps of:
   providing a carbon dioxide gas stream; and
   directing a focused beam of light from a carbon dioxide laser into said stream of carbon dioxide gas at atmospheric pressure to generate a plasma.

22. The method of claim 21 wherein said laser is operated in a pulsed mode.

23. The method of claim 21 wherein said beam is generally coaxial with said stream of carbon dioxide gas.

24. The method of claim 21 wherein a focal point of said beam is coincident with said stream of carbon dioxide gas and plasma is generated adjacent the focal point of said beam.

25. The method of claim 21 also comprising the additional steps of:
   providing a metal body; and
   applying said stream of carbon dioxide gas and said laser beam onto a portion of the metal body to form plasma adjacent to said portion of the metal body.

26. A method of treating the surface of a metallic body, comprising the steps of:
   irradiating a portion of the body with a laser beam;
   applying a stream of carbon dioxide gas onto said portion of the body simultaneously with said laser beam; and
   terminating the irradiating step while continuing, at least temporarily, to apply said stream of gas onto the body to cool it.

* * * * *